United States Patent [19]

Wheatley, Jr. et al.

[11] Patent Number: 4,639,754

[45] Date of Patent: Jan. 27, 1987

[54] VERTICAL MOSFET WITH DIMINISHED BIPOLAR EFFECTS

[75] Inventors: Carl F. Wheatley, Jr., Butler Township, Luzerne County; John M. S. Neilson, Lower Providence Twsp, Montgomery County, both of Pa.; John P. Russell, Hopewell Township, Mercer County, N.J.

[73] Assignee: RCA Corporation, Princeton, N.J.

[21] Appl. No.: 705,371

[22] Filed: Feb. 25, 1985

[51] Int. Cl.$^4$ .............................................. H01L 29/78
[52] U.S. Cl. .................... 357/23.4; 357/23.3; 357/23.1
[58] Field of Search ............... 357/23.3, 23.4, 23.1

[56] References Cited

U.S. PATENT DOCUMENTS

| | | | |
|---|---|---|---|
| 4,072,975 | 2/1978 | Ishitani | 357/23 |
| 4,364,073 | 12/1982 | Becke et al. | 357/23 |
| 4,443,931 | 4/1984 | Baliga et al. | 29/571 |
| 4,532,534 | 7/1985 | Ford et al. | 357/23.4 |

*Primary Examiner*—Martin H. Edlow
*Assistant Examiner*—Terri M. Henn

*Attorney, Agent, or Firm*—Birgit E. Morris; Donald S. Cohen; Kenneth R. Glick

[57] ABSTRACT

An IGFET device includes a semiconductor wafer having a first conductivity type drain region contiguous with a wafer surface. A second conductivity type body region extends into the wafer from the wafer surface so as to form a body/drain PN junction having an intercept at the surface; the body region further including a body-contact portion of relatively high conductivity disposed at the surface. A first conductivity type source region extends into the wafer so as to form a source/body PN junction which has first and second intercepts at the surface. The first intercept is spaced from the body/drain intercept so as to define a channel region in the body region at the surface, and the second intercept is contiguous with the body contact portion. The second intercept is relatively narrowly spaced from the first intercept along most of the length of the first intercept and is relatively widely spaced from the first intercept at one or more predetermined portions. A source electrode contacts the body-contact portion and the source region on the wafer surface.

7 Claims, 7 Drawing Figures

VERTICAL MOSFET WITH DIMINISHED BIPOLAR EFFECTS

The present invention relates to insulated gate field effect transistors (IGFETs) such as metal oxide semiconductor field effect transistors (MOSFETs). More particularly, the invention relates to vertical double-diffused MOSFET (VDMOS) devices having source and gate electrodes on one surface of a semiconductor wafer and a drain electrode on an opposing surface of the semi-conductor wafer. The invention further relates to VDMOS devices that incorporate four semiconductor layers and which are known as conductivity modulated field effect transistors (COMFETs).

BACKGROUND OF THE INVENTION

A conventional VDMOS device includes a semi-conductor wafer in which source, body and drain regions of alternate conductivity type are disposed in series. A portion of the body region is adjacent to a first wafer surface and is bounded by the source and drain regions at that surface so as to define the length and width of a channel region in the body region. A gate electrode, separated from the first wafer surface by an oxide layer, overlies the channel region. A source electrode is disposed on the first surface so as to ohmically contact both the source and body regions, and a drain electrode is disposed on the second surface in ohmic contact with the drain region. The portion of the body region that is contacted by the source electrode is separated from the channel region, at the first surface, by the source region. To facilitate the connection between the source electrode and the body region, the body region typically incorporates a contact portion which is of the same conductivity type as the remainder of the body region but is of relatively high conductivity compared thereto.

During device operation, an appropriate voltage on the gate electrode inverts the conductivity type of the body region in that portion of the channel region that is contiguous with the wafer surface. The so-called inversion channel thereby produced permits a unipolar current flow between the source and drain regions. This unipolar electron flow (for an N channel device) or hole flow (for a P channel device) is selectively modulated by the voltage applied to the gate electrode. However, this source/body/drain structure inherently also produces a parasitic NPN or PNP bipolar transistor which is detrimental to the MOSFET performance.

In an effort to reduce the effects of this parasitic bipolar transistor a variety of structures have been suggested. For example, see U.S. patent application Ser. No. 582,601, VERTICAL MOSFET WITH REDUCED BIPOLAR EFFECTS AND METHOD FOR MAKING SAME, L. A. Goodman et al. filed Feb. 22, 1984; Ser. No. 605,427, MOSFET WITH REDUCED BIPOLAR EFFECTS, J. M. S. Neilson et al. filed Apr. 30, 1984; and U.S. Pat. No. 4,072,975, INSULATED GATE FIELD EFFECT TRANSISTOR, A. Ishitani, Feb. 7, 1978. In a further effort to effectively reduce the parasitic bipolar transistor, the configuration of the present invention was conceived. Furthermore, the structure of the present invention permits greater manufacturing tolerances and a commensurate improvement in manufacturing yield, so as to be advantageous even if the effects of the parasitic bipolar transistor were unaltered.

SUMMARY OF THE INVENTION

An IGFET device includes a semiconductor wafer having a first conductivity type drain region contiguous with a wafer surface. A second conductivity type body region extends into the wafer from the wafer surface so as to form a body/drain PN junction having an intercept at the surface. The body region further includes a body-contact portion of relatively high conductivity disposed at the surface. A first conductivity type source region extends into the wafer so as to form a source/body PN junction which has first and second intercepts at the surface. The first intercept is spaced from the body/drain intercept so as to define a channel region in the body region at the surface, and the second intercept is contiguous with the body-contact portion. The second intercept is relatively narrowly spaced from the first intercept along most of the length of the first intercept and is relatively widely spaced from the first intercept at one or more predetermined portions. A source electrode contacts the body-contact portion and the source region at the wafer surface.

DETAILED DESCRIPTION OF PREFERRED EMBODIMENT

Figure 1:
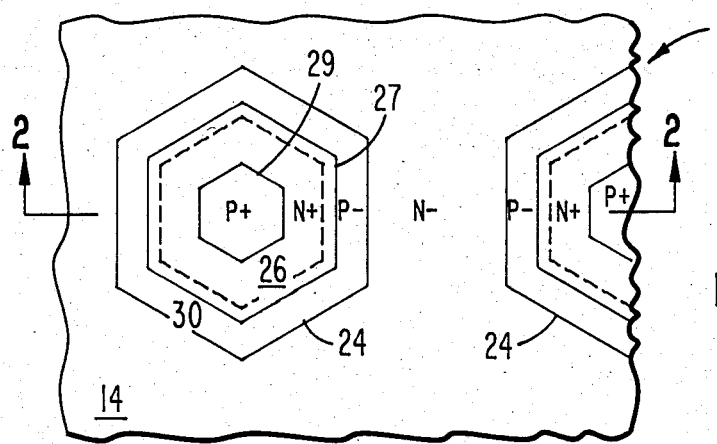
FIG. 1 is a plan view of the semiconductor wafer surface of a conventional VDMOS device.
Figure 2:
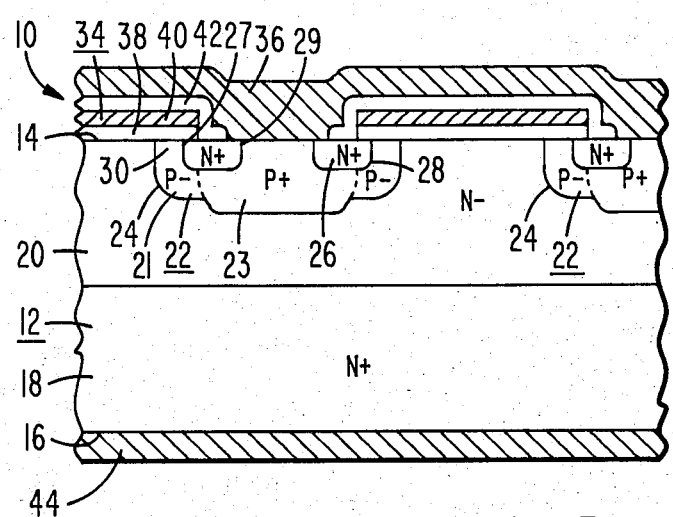
FIG. 2 is a sectional view of the device of FIG. 1 and further includes the structure of the materials which overlie the wafer surface.
Figure 3:
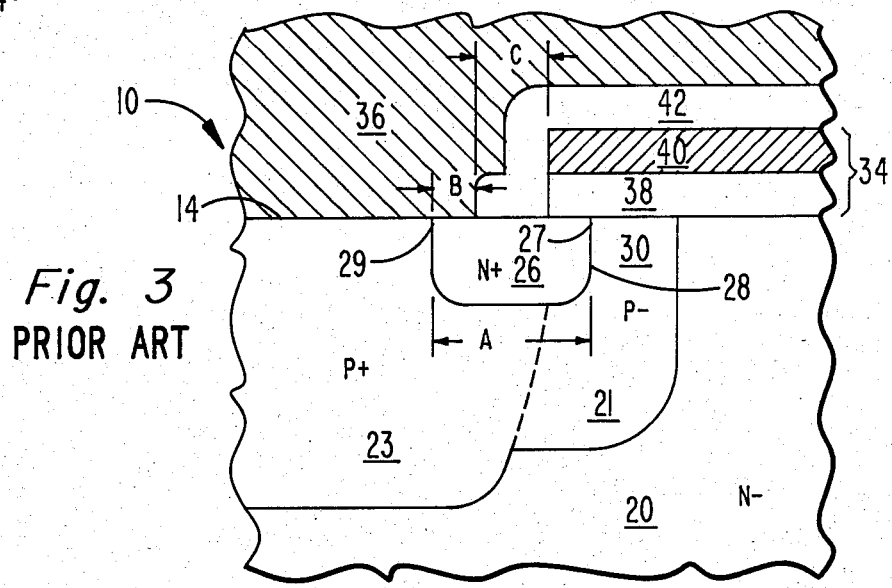
FIG. 3 is an enlarged view of a portion of FIG. 2.

A portion of a conventional VDMOS device 10 is shown in FIGS. 1, 2 and 3. The device 10 comprises a semiconductor wafer 12 having first and second opposing major surfaces 14 and 16. A substantially planar drain region 18, of N+ type conductivity, is disposed across the second surface 16 and an extended drain region 20 of N-type conductivity extends from the drain region 18 to the first surface 14. A plurality of body regions 22 of P type conductivity extend into the wafer 12 from the first surface 14 such that each forms a body/drain PN junction 24 with the extended drain region 20. As shown in FIG. 1, the body/drain PN junction 24 intercepts the first surface 14 in the shape of a hexagon. In a conventional VDMOS structure a plurality of these hexagons are disposed in a two dimensional array at the surface 14, as partially shown in FIG. 1.

Each body region 22 includes a relatively low conductivity portion 21 of P- type conductivity contiguous with a relatively high conductivity portion, herein termed a body-contact portion 23, of P+ type conductivity. The relatively low conductivity portion 21 defines the body/drain PN junction 24 both at the surface 14 and for some distance beneath the surface. The body-contact portion 23 extends into the wafer from the first surface 14 from a substantially central location within each body region hexagon.

Extending into each body region 22 is a source region 26 of N+ type conductivity which forms a source/body PN junction 28 at its interface with the body region 22. Each body region 22 and its associated source region 26 is commonly referred to as a cell of the VDMOS device 10. At the first surface 14 the source/body PN junction 28 has first and second intercepts, 27 and 29 respectively. The first intercept 27 is uniformly spaced from the body/drain PN junction 24 so as to define a hexagonal-ring shaped channel region 30 in the relatively low conductivity portion 21 of the body region 22. The distance between the first intercept 27 and the body/drain PN junction 24 is termed channel length and the distance perpendicular thereto is termed channel width. The channel length for each cell is uniform and is typically within the range of approximately 1-4 microns. The cumulative channel width for all cells on the device 10 is typically in the range of 5 to 50 centimeters. At the second intercept 29, the body-contact portion 23 is typically contiguous with the source region 26. The broken line illustrated in FIG. 1 represents a typical lateral extent of the body-contact portion 23 beneath the source region 26.

Overlying the first surface 14 is an insulated gate electrode 34 and a source electrode 36. The insulated gate electrode 34, which comprises an oxide layer 38 directly on the surface 14 and a conductive electrode 40 overlying the oxide layer, overlies the channel region 30 of each hexagonal cell as well as the extended drain region 20 disposed between cells. The source electrode 36 overlies the insulated gate electrode 34 and is insulated therefrom by insulation 42. The source electrode 36 contacts both the source region 26 and body-contact portion 23, at the first surface 14. At the second surface 16 there is disposed a drain electrode 44 in contact with the drain region 18.

The source, body and extended drain regions 26, 22 and 20 of the VDMOS device 10 can be considered to comprise, respectively, the emitter, base and collector regions of a parasitic NPN bipolar transistor. When the emitter/base junction (i.e., the source/body PN junction 28) of this parasitic transistor is forward biased to a value greater than the barrier potential of approximately 0.6 volts (at room temperature) the parasitic bipolar transistor will turn on. Per Ohm's law, the voltage (E) between two points is equal to the current (i) flowing between those points multiplied by the resistance (R) of the material between those two points. Thus, the voltage drop across the source/body PN junction 28 is influenced both by the current flowing thereacross and the resistivities of the adjacent materials therearound. Such an iR voltage drop occurs, for example, along the lateral dimension of the source/body PN junction 28, as identified at A in FIG. 3. One of the constraints in determining an optimum dimension A is the width of the source electrode 36 contact to the source region 26, as identified at B in FIG. 3. This dimension B is in turn influenced by the lateral dimension of that part of the insulation 42 which overlies the first surface 14, as is identified at C.

The structure of the present invention effectively eliminates the manufacturing constraint which requires a minimum dimension B along the periphery of intercept 29, provides ohmic-ballasting and thus more uniform current distribution throughout the device, and in the preferred embodiment, effectively reduces the likelihood of turn-on of the parasitic bipolar transistor.

Figures 4, 7:
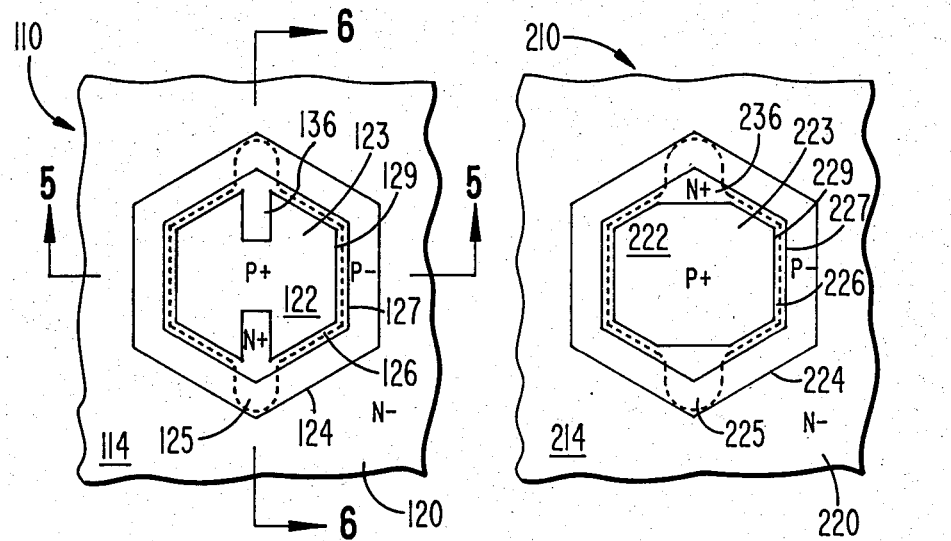
FIG. 4 is a plan view which illustrates a portion of the semiconductor wafer surface of a device which incorporates the preferred embodiment of the present invention.
FIG. 7 is a plan view of an alternative embodiment of the present invention.
Figures 5, 6:
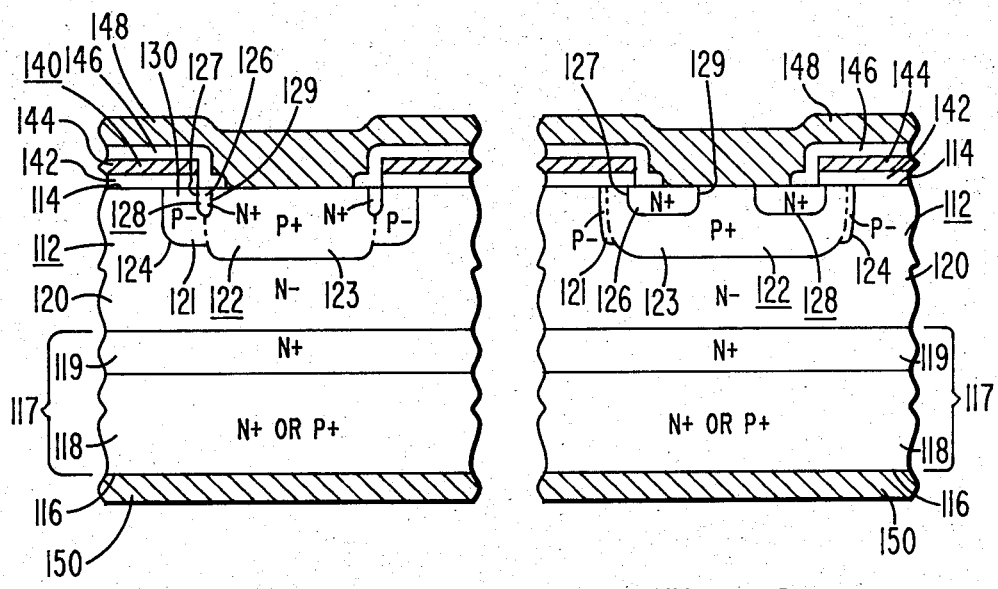
FIG. 5 is a sectional view of the device of FIG. 4 which further includes the structural details of the materials overlying the wafer surface.
FIG. 6 is a second sectional view of the device of FIG. 4 also with the structure of the overlying materials being shown.

A plan view of a cell of a VDMOS device 110 incorporating the structure of the present invention is illustrated in FIG. 4, with sectional views illustrating salient features shown in FIGS. 5 and 6. The device 110 will typically incorporate hundreds or thousands of such cells arranged in a two dimensional array on the surface of a semiconductor wafer. FIG. 7 represents a plan view of an alternative embodiment. The sectional views of FIGS. 5 and 6 are also generally applicable to the device 210 of FIG. 7 although it should be understood that the relative dimensions of the various semiconductor regions may be different.

As shown in the sectional views of FIGS. 5 and 6, the structure of the present invention can be incorporated into either three layer or four layer VDMOS devices. In either case the devices include a semiconductor wafer 112 having first and second opposing major surfaces 114 and 116 respectively. That portion of the wafer 112 which is adjacent to the second surface 116 is of relatively high conductivity and is identified at 117. In a three layer N channel VDMOS device this high conductivity region 117 is of N+ type material and is referred to as a drain region. In a four layer N channel VDMOS device, commonly termed an N channel COMFET, the high conductivity region 117 includes a P+ type region 118 adjacent to the second surface 116 and an optional overlying N+ type region 119 contiguous therewith. In an N channel COMFET, wherein the region 118 adjacent to the second surface 116 is of P+ type material, the region 118 is referred to as an anode region. In a P channel COMFET, wherein all of the conductivity types of the various semiconductor regions are reversed, the region 118 will be of N+ type material and referred to as a cathode region. Further elaboration on the structure of a COMFET can be found in U.S. Pat. No. 4,364,075, POWER MOSFET WITH AN ANODE REGION, H. W. Becke et al., Dec. 14, 1982. In the illustrated N channel device, an extended drain region 120 is contiguous with the high conductivity region 117 and extends to the first surface 114. The extended drain region 120 is of relatively low conductivity N- type material compared to the high conductivity region 117.

Extending into the wafer from the first surface 114 is a P type body region 122 which forms a body/drain PN junction 124 with the extended drain region 120. As with the conventional device structure, the preferred embodiment of the present invention also incorporates a body region having a hexagonal body/drain PN junction intercept at the first surface, as shown in FIG. 4. However, as will subsequently be elaborated upon, the present invention is not limited to a structure which incorporates a hexagonal body region 122.

Also extending into the wafer from the first surface 114 is an N+ type source region 126 which forms a source/body PN junction 128 at its interface with the body region 122. The source/body PN junction 128 has first and second intercepts, 127 and 129 respectively, at the first surface 114. Analogous to the conventional device structure, the first intercept 127 is uniformly spaced from the body/drain PN junction 124 at the first surface 114 and defines a channel region 130 in the body region 122 at the first surface 114. That portion of the body region 122 in which the channel region 130 is formed is of relatively low, P-type conductivity, as identified at 121.

A relatively high conductivity P+ type body-contact portion 123 of the body region 122 extends into the wafer from the surface 114 so as to be contiguous with the low conductivity portion 121 and be adjacent to the source region 126 at the second intercept 129. As shown in FIG. 4, at the first surface 114, the second intercept 129 is relatively narrowly spaced from the first intercept 127 of the source/body PN junction 128 along most of the length of the first intercept 127. In the illustrated device 110 this spacing is substantially uniform and will typically be approximately 3 microns, whereas in a conventional device 10, the comparable spacing (dimension A in FIG. 3) will typically be approximately 8 microns. In the device 110 the second intercept 129 is additionally relatively widely spaced from the first intercept 127 at one or more predetermined portions, these portions being referred to as tabs and identified at 136 in FIG. 4. This relatively wide spacing between the second intercept 129 and the first intercept 127 is illustrated in FIG. 6, a sectional view taken through the tabs 136.

In the illustrated, embodiment two opposing tabs are utilized, however, only one tab is necessary and more than two may be used. Determining an optimum number of tabs requires consideration of such factors as ease of alignment to other photolithographically generated features, the impact on the parasitic bipolar transistor at the tab(s), and the extent to which channel region width can be sacrificed (as will subsequently be elaborated upon).

The described source region configuration provides certain advantages over a conventional device configuration. Further advantages can be realized, however, by additionally altering the configuration of the body-contact portion 123. As shown by the broken line in FIG. 4, the body-contact portion 123 extends a greater lateral distance in areas corresponding to the N+ tab portions 136 than it does in other areas of the source region 126. These areas, referred to as P+ body portion lateral extensions, are identified at 125 in FIG. 4. These lateral extensions 125 extend laterally at least as far as the source region 126, and in the illustrated embodiment, extend laterally almost as far as the body/drain PN junction 124.

It should be further noted that in another possible configuration within the scope of this invention, the P+ body portion lateral extensions extend laterally beyond the low conductivity portion of the body region so as to form part of the source/body PN junction with the extended drain region. This configuration would cause the P- type body region 121 to be completely eliminated in those areas where the P+ lateral extensions occur. However, notwithstanding the commensurate loss of, for example, 15 percent of the channel region 130 width, such a configuration would yield an improved device from the standpoint of decreased parasitic bipolar effects.

On the first surface 114, overlying the channel region 130 of each cell and the extended drain region 120 between cells is an insulated gate electrode 140 which comprises a layer of insulation such as silicon dioxide 142 on the wafer surface 114 and a gate conductor 144 such as doped polycrystalline silicon on the insulator 142. A layer of insulation such as phosphosilicate glass (PSG) 146 covers the insulated gate electrode 140. A source electrode 148, of a material such as aluminum, overlies the insulation 146 and contacts the source region 126 and body-contact portion 123 at the first surface 114. As shown in FIGS. 5 and 6, in the preferred embodiment the source electrode 148 contacts the source region 126 only via the tabs 136. A drain electrode 150 is disposed across the surface 116 so as to contact the high conductivity N+ or P+ type region 118.

As shown in FIG. 5, since the source region 126 of the device 110 is significantly more narrow than the source region 26 (dimension A) of the conventional device 10, the width of the overlying insulation 146 (the equivalent of dimension C in the conventional device 10) should be such that this relatively narrow portion of the source region 126 is not exposed to the source electrode at the first surface 114. In the preferred embodiment of the present invention the source region dimensions are designed such that the source electrode 148 makes contact to the source region 126 only at the tabs 136.

It should further be noted, that due to misalignment of various mask levels during the fabrication process, making contact to the source region with the source electrode is frequently a problem in the fabrication of conventional devices, even when the dimension A is not relatively narrow. In devices of the present invention, the source region tabs 136, by providing relatively large targets, insure that the source region 126 will be contacted by the source electrode 148 despite a certain degree of misalignment encountered during manufacturing.

Shown in FIG. 7 is the wafer surface 214 of a device 210 incorporating the present invention but having a somewhat different physical structure. Basically, the differences between the device 210 and the device 110 are in the geometry of the tabs 236 of the N+ source region 226 and the corresponding lateral extensions 225 of the P+ body-contact portion 223. Whereas in device 110 the tabs 136 are substantially rectangular extensions of the source region 126 at the surface 114, in device 210 the tabs 236 are each formed by truncating a hexagonal corner of the second intercept 229 of the source region 226. This yields a device wherein the relatively wide spacing(s) between the first intercept 227 and second intercept 229 is a generally triangular shape. In device 110, the width of the lateral extensions 125 of the body-contact portion are substantially equivalent to the width of the source region tabs 136 to which they correspond. Similarly, in a device 210 the width of the body-contact portion lateral extensions 225 is related to the width of the source region tabs 236. Again, the lateral extensions 225 may, in some designs, extend so as to locally envelope the P-body region and define part of the body/drain PN junction 224 between the body region 222 and extended drain region 220.

The devices 110 and 210 of the present invention can be fabricated by conventional VDMOS manufacturing techniques. For example, the following conventional VDMOS manufacturing process can be used:

(1) provide an appropriately doped semi-conductor wafer;

(2) selectively implant and diffuse the body-contact portion of the body region;

(3) form the insulated gate electrode;

(4) implant and diffuse the body region;

(5) form a source-exclude mask (on that area of the exposed body region which is not to be doped with the source region dopant);

(6) implant and diffuse the source region;

(7) form an insulating layer over the insulated gate electrode;

(8) define the source electrode contact area in the insulating layer; and (9) provide source and drain electrode metallization.

VDMOS devices of the present invention can be fabricated within the context of the indicated conventional processing steps. The only necessary differences to the process for the manufacture of a device 110 or 210 are in artwork (e.g. photomask) modifications. More specifically, the photomasks (or other pattern-generating means) used to define the body-contact portion (step 2) and the source-exclude portion (step 5) must be appropriately modified so as to create source region tabs 136, 236 and body-contact portion lateral extensions 125, 225.

In devices of the present invention the configuration of the source region and body-contact portion provides a relatively large contact area between the source electrode and the body region and thereby creates a lower contact resistance than is present in a conventional device.

The source region tabs also provide an effect which may conveniently be termed either source-ballasting or ohmic-ballasting. That is, since the tabs provide a greater length of source region, and hence a greater resistance through which current must flow, a greater voltage drop occurs therein than would occur normally. Therefore, a correspondingly greater voltage drop is required in the body region in order to forward bias the source/body PN junction to a voltage greater than the barrier potential. This feature is particularly significant as the temperature of the device increases, as it does during typical operation, and the 0.6 volt room temperature barrier potential decreases. This feature also provides less susceptibility to having the barrier potential exceeded when current flows through the body region as a result of, for example, relatively fast drain-to-source voltage transitions (high dV/dt) or nuclear radiation.

Perhaps the most significant advantage of the structure of the present invention occurs when the body-contact portion lateral extensions 125 or 225 are present (in areas corresponding to the source region tabs 136 and 236). The reduced width of the source region 126 (or 226) at the wafer surface, i.e. the relatively narrow spacing between the first intercept 127 (or 227) and second intercept 129 (or 229), significantly decreases the magnitude of the iR drop associated with current flow in the body region 122 (or 222) beneath the source region 126 (or 226). This significantly decreases the tendency of the parasitic NPN bipolar transistor to turn on, and is especially significant in COMFET devices where when one of the parasitic bipolar transistors turns on the device latches into a thrysistor-like regenerative mode. The presence of the source region tabs 136 and 236 permits the source electrode to contact the otherwise relatively narrow source regions 126 and 226. However, if the body-contact portion lateral extensions 125 and 225 were not present in areas corresponding to the tabs, then an increased voltage drop, in the body region 122, introduced by the length of the tabs, would occur. The relatively high conductivity lateral extensions 125 and 225 serve to lower the iR drop which occurs in the body regions 122 and 222 in the vicinity of the source region tabs 136 and 236. This results in decreased tendency for the parasitic bipolar transistor to turn on and a decreased tendency for a COMFET device to latch.

Lastly, it should be recognized that the present invention is not limited to the specific structures described herein. For example, the present invention can readily be incorporated into an array of polygonal channel regions which are other than hexagonal or into an interdigitated or meandering channel type of VDMOS configuration. An example of a meandering channel configuration can be found in U.S. Pat. No. 4,366,495, VERTICAL MOSFET WITH REDUCED TURN-ON RESISTANCE, L. A. Goodman et al., Dec. 28, 1982. In such a structure, the source region tab(s) and corresponding body-contact portion lateral extension(s) could be, for example, periodically spaced along the interdigitated source/drain fingers.

It should also be noted that although the present invention has been described in terms of a device having specific N or P type semiconductor regions, the invention is not so limited. For example, all of the indicated conductivity types could be reversed so as to yield a P channel three layer VDMOS device or P channel COMFET.

What is claimed is:

1. In an insulated gate field effect transistor device comprising a semiconductor wafer including a drain region of first conductivity type contiguous with a wafer surface, a body region of second conductivity type extending into the wafer from said surface so as to form a body/drain PN junction having an intercept at said surface, said body region including a body-contact portion of relatively high conductivity at said surface, a source region of first conductivity type extending into the wafer from said surface so as to form a source/body PN junction having first and second intercepts at said surface, said first intercept being spaced from said body/drain intercept so as to define a channel region in the body region at said surface, said second intercept being contiguous with said body-contact portion, and a source electrode on said wafer surface in contact with said body-contact portion and said source region, the improvement comprising:

said second intercept being relatively narowly and substantially uniformly spaced from said first intercept along most of the length of said first intercept and being significantly more widely spaced from said first intercept at one or more predetermined portions; and said body-contact portion including lateral extensions beneath said source region in areas corresponding to said widely spaced portions.

2. A device in accordance with claim 1 wherein said source electrode contacts said source region only at said one or more relatively widely spaced portions.

3. A device in accordance with claim 1 wherein said body-contact portion lateral extensions extend laterally so as to contact the drain region.

4. A device in accordance with claim 1 wherein said body/drain PN junction intercept is a polygon and said first intercept of the source/body PN junction is uniformly spaced therefrom so as to define said channel region.

5. A device in accordance with claim 4 wherein said body/drain PN junction intercept is a hexagon.

6. A device in accordance with claim 1 wherein said relatively wide spacing between the first intercept and the second intercept is in the form of a rectangular projection of the source region at the wafer surface.

7. A device in accordance with claim 1 wherein said relatively wide spacing between the first intercept and the second intercept comprises a generally triangular shape.

* * * * *